(12) United States Patent
Li et al.

(10) Patent No.: US 11,758,688 B2
(45) Date of Patent: Sep. 12, 2023

(54) HEAT DISSIPATION DEVICE

(71) Applicant: Cambricon Technologies Corporation Limited, Beijing (CN)

(72) Inventors: Kun Li, Beijing (CN); Dejing Wang, Beijing (CN); Shuo Xing, Beijing (CN)

(73) Assignee: CAMBRICON TECHNOLOGIES CORPORATION LIMITED, Beijing (CN)

( * ) Notice: Subject to any disclaimer, the term of this patent is extended or adjusted under 35 U.S.C. 154(b) by 24 days.

(21) Appl. No.: 16/385,762

(22) Filed: Apr. 16, 2019

(65) Prior Publication Data

US 2019/0335620 A1    Oct. 31, 2019

(30) Foreign Application Priority Data

Apr. 28, 2018 (CN) .......................... 201810404001.0

(51) Int. Cl.
*F28F 7/00* (2006.01)
*H05K 7/20* (2006.01)
*G06F 1/20* (2006.01)

(52) U.S. Cl.
CPC .......... *H05K 7/20336* (2013.01); *G06F 1/20* (2013.01)

(58) Field of Classification Search
CPC .......... H05K 7/20336; H05K 7/20172; H05K 7/20145; H01L 23/427; F28D 15/0275
See application file for complete search history.

(56) References Cited

U.S. PATENT DOCUMENTS

| 7,021,368 | B2* | 4/2006 | Lin | ........................ | H01L 23/427 |
| | | | | | 165/104.33 |
| 7,059,391 | B2* | 6/2006 | Whitney | ............. | F28D 15/0275 |
| | | | | | 361/700 |
| 7,278,470 | B2* | 10/2007 | Xia | ........................ | H01L 23/427 |
| | | | | | 361/700 |

(Continued)

FOREIGN PATENT DOCUMENTS

GB            276998 A  * 10/1928  ........... F04D 29/282

OTHER PUBLICATIONS

EP19169331.6, European Search Report dated Oct. 10, 2019, 2 pages.

(Continued)

*Primary Examiner* — Claire E Rojohn, III
(74) *Attorney, Agent, or Firm* — Getech Law LLC; Jun Ye

(57) ABSTRACT

Disclosed is a heat dissipation device including a base, a plurality of heat pipes and a heat dissipation structure. The base includes a support plate, a plurality of through-pipe grooves are arranged in the support plate. Each heat pipe includes a heat absorption section and a heat transfer section connected to the heat absorption section, where the heat absorption section is arranged in the through-pipe grooves and at least one heat transfer section of the heat pipe is away from the support plate in the perpendicular direction to the support plate. The heat dissipation structure is arranged on the first surface of the support plate, and the heat transfer section of the plurality of heat pipes extends into the interior of the heat dissipation structure and thermally contacts the heat dissipation structure. The heat dissipation device of the present disclosure dissipates heat faster.

9 Claims, 9 Drawing Sheets

(56) References Cited

U.S. PATENT DOCUMENTS

| | | | | |
|---|---|---|---|---|
| 7,440,279 | B2* | 10/2008 | Lai | H01L 23/427 165/104.33 |
| 7,679,912 | B1* | 3/2010 | Xiong | F28D 15/0275 165/104.33 |
| 7,768,784 | B2* | 8/2010 | Lai | H01L 23/467 174/16.3 |
| 7,779,897 | B2* | 8/2010 | Jin | F28D 15/0275 165/104.33 |
| 7,866,376 | B2* | 1/2011 | Jiang | H01L 23/427 165/104.33 |
| 7,990,719 | B2* | 8/2011 | Chen | H05K 7/20154 174/16.3 |
| 8,159,819 | B2* | 4/2012 | Memon | H01L 23/427 361/700 |
| 8,325,484 | B2* | 12/2012 | Lo | G06F 1/20 361/679.48 |
| 9,606,589 | B2* | 3/2017 | Gallina | H05K 7/20145 |
| 9,797,660 | B2* | 10/2017 | Huang | F28D 15/0275 |
| D805,042 | S * | 12/2017 | Huang | D13/179 |
| 9,894,748 | B2* | 2/2018 | Tsunoda | H05K 7/2039 |
| 9,905,495 | B2* | 2/2018 | Lin | F28D 15/0275 |
| 9,909,815 | B2* | 3/2018 | Lan | F28D 15/0275 |
| 11,147,185 | B2* | 10/2021 | Sugawara | H05K 7/20154 |
| 2008/0047693 | A1 | 2/2008 | Chen | |
| 2012/0114512 | A1* | 5/2012 | Lofy | F04D 17/08 417/410.1 |
| 2014/0209273 | A1* | 7/2014 | Hsu | F28D 15/0275 165/80.2 |
| 2017/0198980 | A1* | 7/2017 | Lan | F28D 15/0275 |

OTHER PUBLICATIONS

EP 19169331.6—Communication Pursuant to Article 94(3) EPC, dated Aug. 13, 2020, 4 pages.

EP 19169331.6—Response to Communication of Nov. 18, 2019 pursuant to Rule 70 EPC, filed May 11, 2020, 78 pages.

CN201810404001.0—First Office Action dated May 24, 2023, 13 pages. (With Brief Enlish Explanation).

* cited by examiner

HEAT DISSIPATION DEVICE

TECHNICAL FIELD

The present disclosure relates to the field of heat dissipation, and particularly relates to a heat dissipation device.

BACKGROUND

In recent years, the breakthrough in artificial intelligence has brought earth-shaking changes to the information industry. Accelerator cards based on ASIC chips and FPGA chips have achieved faster data acquisition, data processing, classification and prediction through a plurality of artificial intelligence algorithms, especially machine learning algorithms. The acceleration cards have achieved an order of magnitude reduction in computing time.

Higher requirements are placed by the above algorithms on hardware computing power, and the change of computing power brings corresponding changes in power consumption, which challenges the heat dissipation ability of the acceleration cards, while the heat dissipation effect of traditional heat dissipation devices applied to the acceleration cards is unsatisfactory.

SUMMARY

In view of this, it is necessary to provide a heat dissipation device to overcome the problem of poor heat dissipation effect in traditional heat dissipation devices.

A heat dissipating device includes:

a base, including a support plate, and the support plate has a first surface and a second surface opposite to the first surface;

a plurality of through-pipe grooves disposed on the support plate, and the through-pipe grooves penetrate the first surface and the second surface;

a plurality of heat pipes, each of the heat pipes including a heat absorption section and a heat transfer section connected to the heat absorption section, where the heat absorption section is arranged in the through-pipe grooves and the heat transfer section of at least one heat pipe is away from the support plate in the perpendicular direction to the support plate; and a heat dissipation structure arranged on the first surface, where the heat transfer sections of the plurality of heat pipes extend into the interior of the heat dissipation structure and contacts the heat dissipation structure.

In one embodiment, the heat dissipation structure is arranged with a plurality of heat transfer section accommodation chambers for accommodating the heat transfer sections of the plurality of heat pipes.

In one embodiment, the plurality of through-pipe grooves are through grooves spaced in parallel.

In one embodiment, the heat transfer section includes a bend portion and an extension portion connected to the bend portion, the bend portion is arc-shaped and the extending direction of the extension portion is parallel to the extending direction of the through-pipe grooves.

In one embodiment, the base further includes a heat conducting plate arranged on the second surface and the heat conducting plate covers the plurality of through-pipe grooves. The heat absorption section is in thermal contact with the heat conducting plate.

In one embodiment, the base further includes a frame arranged around the support plate and the frame is fixed to the edge of the support plate. The frame and the support plate form an accommodating space in which the heat dissipation structure and the heat pipes are accommodated.

In one embodiment, part of the heat pipes are attached to the support plate, and the first surface is arranged with a buried-pipe groove to accommodate the heat transfer section of part of the heat pipes attached to the support plate.

In one embodiment, the heat dissipation structure includes multiple sets of heat dissipation fins spaced in parallel. The gap between two adjacent heat dissipation fins forms a strip air duct, and two ends of the strip air duct are an air inlet and an air outlet respectively.

In one embodiment, the heat dissipation device further includes a turbo fan arranged on the first surface and the turbo fan is arranged opposite to the air inlet.

In one embodiment, the turbo fan includes:

a rotor housing; and a fan blade structure, arranged around the rotor housing and fixed to the periphery of the rotor housing, and the fan blade structure includes a plurality of spaced fan blades extending in the same direction, where a cross section of the fan blade is an arc and a length of the arc is $\frac{1}{8}$-$\frac{1}{6}$ of a circumference of a circle in which the arc is located.

In one embodiment, the rotor housing includes:

an accommodation bucket, forming a fan rotor accommodation space around to accommodate a fan rotor; and an annular connecting plate fixedly connected to the outer edge of the accommodation bucket, and the fan blade structure arranged around the annular connecting plate and fixedly connected to the annular connecting plate.

In one embodiment, the accommodation bucket includes:

a top plate of accommodation bucket;

a side plate of accommodation bucket, arranged around the edge of the top plate of accommodation bucket and fixedly connected to the edge of the top plate of accommodation bucket, the annular connecting plate fixedly arranged at one side of the side plate of accommodation bucket away from the top plate of accommodation bucket.

In one embodiment, a diameter of a circle in which an arc-shaped cross section of the fan blade is $\frac{1}{10}$-$\frac{1}{6}$ of an outer diameter of the fan blade structure.

In one embodiment, the turbo fan further includes an annular bracket arranged around the rotor housing, and the annular bracket fixedly connected to the plurality of fan blades.

In one embodiment, the turbo fan further includes an installation chassis, including an installation plate and a side plate arranged in the periphery of the installation plate, where the side plate and the installation plate form a groove around. The side plate is arranged with a wire passing groove, and the installation chassis and the rotor housing are oppositely and rotatably connected.

In one embodiment, the turbo fan further includes a fan terminal, and the fan terminal includes:

a connecting arm, an end of the connecting arm fixedly connected to the side plate; and a wire pressing arm, an end of the wire pressing arm fixedly connected to another end of the connecting arm away from the side plate and another end of the wire pressing arm spaced with the side plate. The wire pressing arm and the connecting arm are located on a same plane as the installation plate. A surface of the wire pressing arm away from the rotor housing is arranged with a wire pressing groove, and the wire pressing groove is arranged corresponding to the wire passing groove.

In one embodiment, the heat dissipation device further includes a guide wall, arranged on the first surface and around the turbo fan, where the guide wall is arranged with a guide outlet, and the guide outlet is oriented towards the air inlet.

In one embodiment, the heat dissipation device further includes a baffle, facing to the air outlet and fixedly connected to the base.

In one embodiment, the heat dissipation device further includes a backplane, arranged oppositely to the outlet and fixedly connected to the support plate.

The embodiments of the present disclosure provide a heat dissipation device, including a base, a plurality of heat pipes and a heat dissipation structure, where the heat dissipation device transfers heat directly to the heat dissipation structure through the base and the heat pipes, and dissipates heat through the heat dissipation structure. At least one of the heat pipes enlarges contact area between the heat pipes and the heat dissipation structure by extending the heat transfer section into the heat dissipation structure and fixedly connecting with the heat dissipation structure, thereby dissipating heat faster.

DESCRIPTION OF REFERENCE NUMBERS IN THE ACCOMPANIED DRAWINGS

10 Heat Dissipation Device
100 Base
110 Support Plate
112 First Surface
114 Second Surface
116 Through-pipe Groove
120 Heat Conducting plate
130 Frame
134 Accommodation Space
200 Heat Pipe
210 Heat Absorption Section
220 Heat Transfer Section
222 Bend Portion
224 Extension Portion
300 Heat Dissipation Structure
310 Heat Transfer Section Accommodation Chamber
320 Strip Air Duct
322 Air Inlet
324 Air Outlet
400 Turbo Fan
410 Rotor Housing
412 Accommodation Bucket
4122 Top Plate of Accommodation Bucket
4124 Side Plate of Accommodation Bucket
4126 Heat Dissipation Hole
414 Annular Connecting Plate
420 Fan Blade Structure
422 Fan Blade
4222 Air Intake
4224 Air Output
430 Annular Bracket
440 Installation Chassis
442 Installation Plate
444 Side Panel
4442 Wire Passing Groove
450 Fan Terminal
452 Connecting Arm
454 Wire Pressing Arm
4542 Wire Pressing Groove
500 Guide Wall
600 Baffle
700 Backplane
710 Reinforcement Rib

DETAILED DESCRIPTION OF THE EMBODIMENTS

To make the above purposes, features and advantages of the present disclosure clearer and easier to understand, specific embodiments of the present disclosure will be described in detail hereinafter with reference to the accompanied drawings. Details are described below to make the present disclosure fully understood. However, the present disclosure may be implemented in other ways and those skilled in the art can make similar improvements without departing from the scope of the present disclosure, and thus the present disclosure is not limited by the specific embodiments disclosed below.

It should be noted that when an element is referred to as being "fixed" to another element, the element may be directly arranged on an other element or the element is arranged on the other element by a centering element; when an element is referred to as being "connected" to another element, the element may be directly connected to the other element or the element is connected to the other element by a centering element.

Unless otherwise defined, all technical and scientific terms used herein have the same meaning as the terms commonly understood by those of ordinary skill in the art to which the present disclosure applies. The terms used herein are only for the purpose of describing specific embodiments, and are not intended to limit the present disclosure. The term "and/or" used herein includes any and all combinations of one or a plurality of the relevant listed items.

Figure 1:
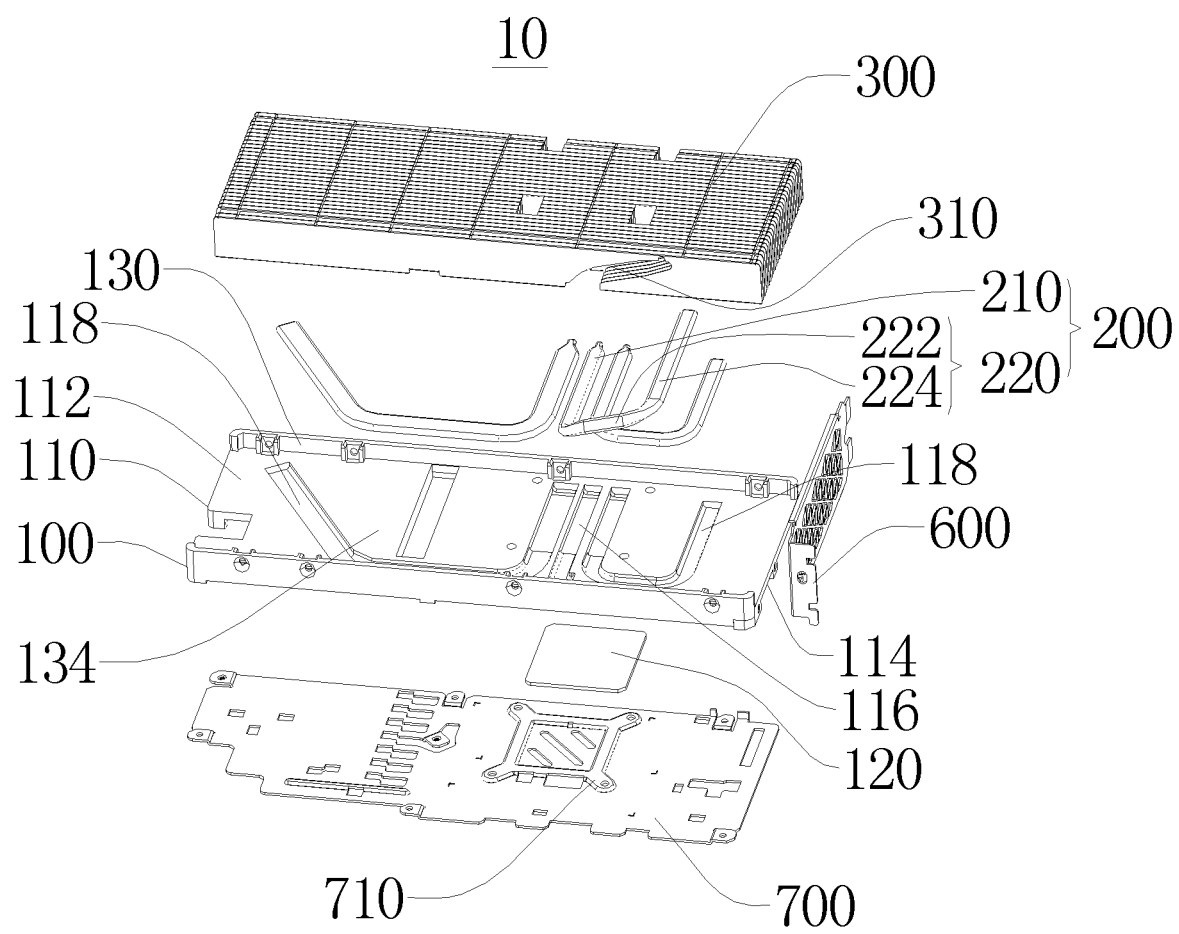
FIG. 1 is an exploded diagram of a heat dissipation device according to an embodiment of the present disclosure.
Figure 2:
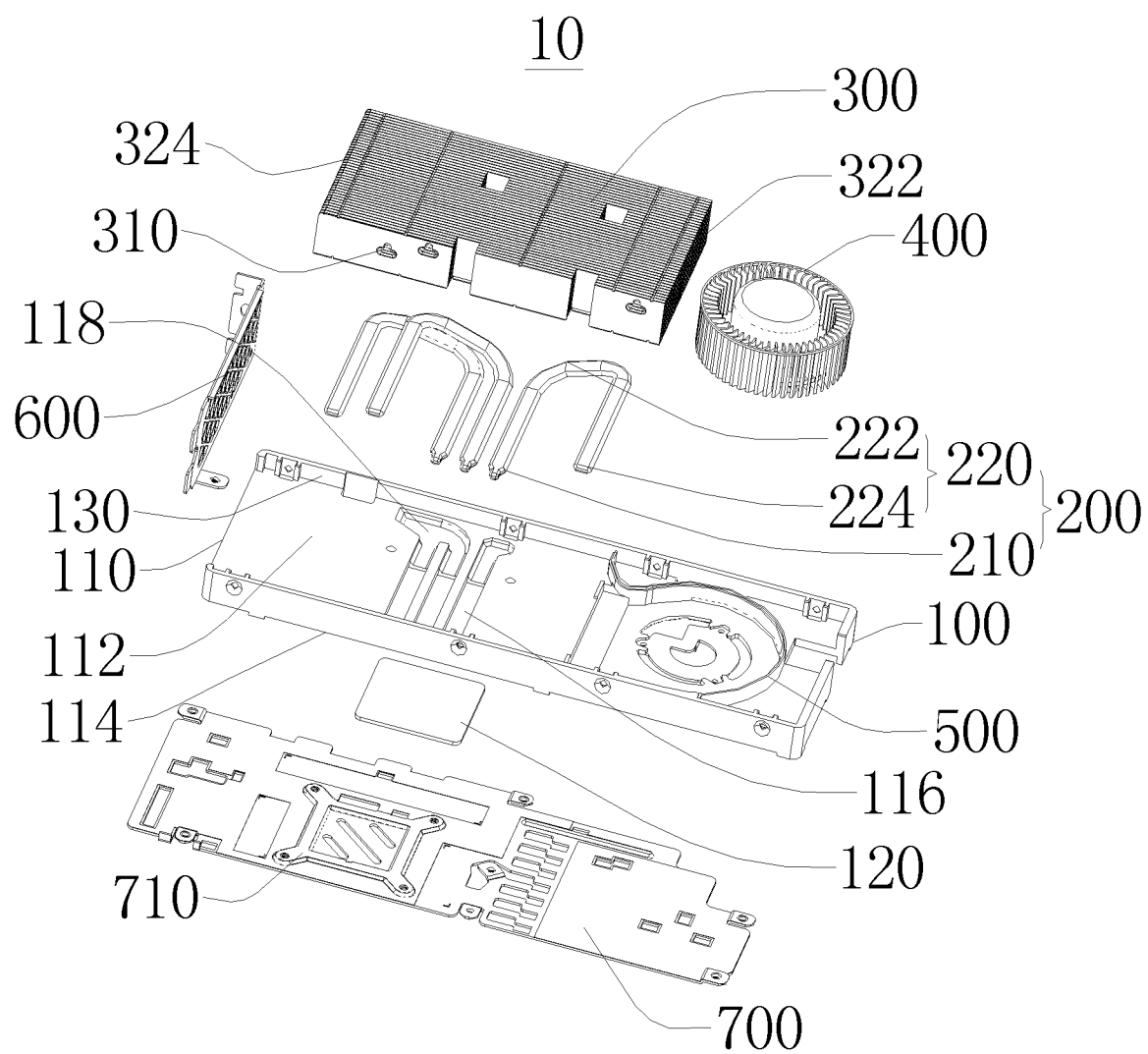
FIG. 2 is an exploded diagram of a heat dissipation device according to another embodiment of the present disclosure.

Referring to FIG. 1 and FIG. 2, an embodiment of the present disclosure provides a heat dissipation device 10, including a base 100, a plurality of heat pipes 200, and a heat dissipation structure 300. The base 100 includes a support plate 110. The support plate 110 includes a first surface 112 and a second surface 114 opposite to the first surface 112. A plurality of through-pipe grooves 116 are disposed on the support plate 110 for engaging with heat pipes, and penetrate the first surface 112 and the second surface 114. Each heat pipe 200 includes a heat absorption section 210 and a heat transfer section 220 connected to the heat absorption section 210, where the heat absorption section 210 is arranged in the through-pipe grooves 116 and at least one heat transfer section 220 of the heat pipe 200 is away from the support plate 110 in the perpendicular direction to the support plate 110. The heat dissipation structure 300 is arranged on the first surface 112, and the heat transfer sections 220 of at least one heat pipes 200 extend into the interior of the heat dissipation structure 300 and are in thermal contact with the heat dissipation structure 300.

The material of the base 100 may be metal or other thermally conductive material as long as the shape can be maintained. In one embodiment, the base 100 can be made of aluminum or aluminum alloy to make the base 100 portable with excellent thermally conductive performance. In one embodiment, the shape of the base 100 may be plate.

The plurality of through-pipe grooves 116 can be through grooves so that the plurality of heat pipes 200 can penetrate the base 100. The shape of the through-pipe grooves 116 is not limited, as long as the heat pipes 200 can penetrate the grooves. In one embodiment, the through-pipe grooves 116 may be a long strip. The number of the through-pipe grooves 116 is the same as that of the heat pipes 200.

The material of the heat dissipation structure 300 can be metal or other thermally conductive material. In one embodiment, the material of the heat dissipation structure 300 may be any one or multiple combinations of aluminum, aluminum alloy, copper or copper-aluminum alloy. The heat dissipation structure 300 is fixedly connected to the support plate 110 of the base 100. In one embodiment, the heat dissipation structure 300 is welded together with the base 100, so that the heat can be directly transferred from the base 100 to the heat dissipation structure 300 and then fast dissipated through the heat dissipation structure 300.

The overall shape of the heat pipe 200 is not limited. In one embodiment, the shape of heat pipe 200 can be flat-round. In one embodiment, the extended shape of the heat pipe 200 can be a "L" type or a "U" type. A plurality of the heat pipes 200 may be included to conduct heat faster.

In one embodiment, the heat dissipation device 10 can be configured to dissipate heat generated by a board card. The board card is connected to the support plate 110, and the heat pipe 200 covers a power-hungry chip of the board card. In one embodiment, three heat pipes 200 may be included, and the heat absorption sections 210 of the three heat pipes 200 cover the chip surface at an equal interval. The heat transfer section 220 of the heat pipe 200 extends into the interior of the heat dissipation structure 300 and can fully contact the heat dissipation structure 300. In one embodiment, the heat pipe 200 is welded in the heat dissipation structure 300, thus facilitating heat transfer and achieving better overall stability.

In the embodiment, heat is directly transferred to the heat dissipation device 10 to the heat dissipation structure 300 through the base 100 and the heat pipes 200 of the heat dissipation device 10, and is dissipated through the heat dissipation structure 300. At least one of the heat pipes 200 enlarges the contact area between the heat pipes 200 and the heat dissipation structure 300 by extending the heat transfer section 220 into the heat dissipation structure 300 and fixedly connecting with the heat dissipation structure 300, thereby dissipating heat faster.

Figure 3:
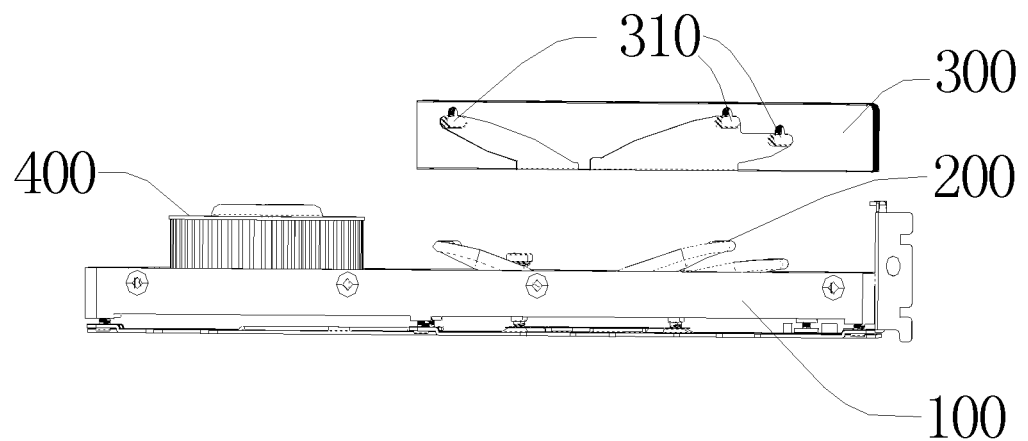
FIG. 3 is a partial exploded front view of a heat dissipation device according to an embodiment of the present disclosure.
Figure 4:
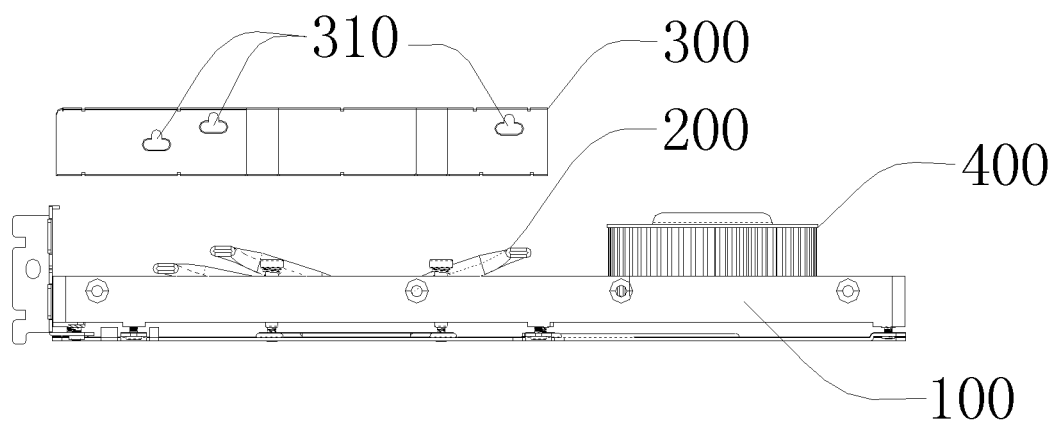
FIG. 4 is a partial exploded rear view of the heat dissipation device shown in FIG. 3.
Figure 5:
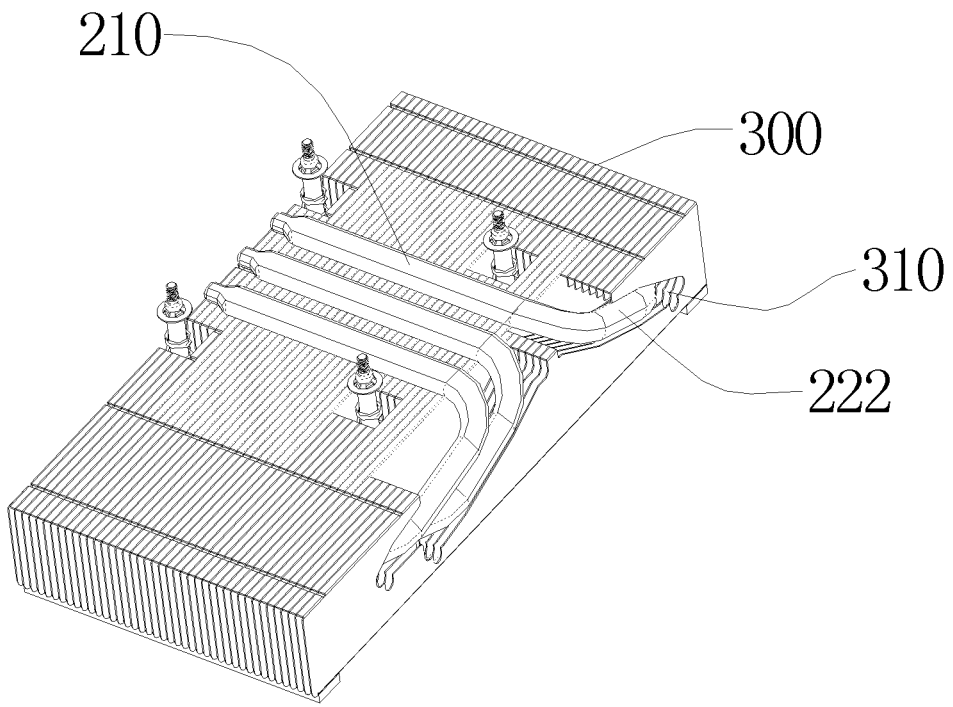
FIG. 5 is a diagram of a combined structure of a heat dissipation structure and heat pipes according to an embodiment of the present disclosure.

Referring to FIG. 3, FIG. 4 and FIG. 5, in one embodiment, the heat dissipation structure 300 is arranged with a plurality of heat transfer section accommodation chambers 310 to accommodate the heat transfer sections of the plurality of heat pipes 200. Alternatively, the shape of the heat transfer section accommodation chambers 310 corresponds to the shape of the heat transfer section 220. At least one of the heat transfer section accommodation chambers 310 penetrates the heat dissipation structure 300 in a direction parallel to the extending direction of the through-pipe grooves, i.e., the shape of the heat transfer section accommodation chamber is through-hole. Inner walls of the plurality of heat transfer section accommodation chambers 310 are in thermal contact with the plurality of heat pipes 200. Alternatively, the inner walls of the plurality of heat transfer section accommodation chambers 310 are welded together with the plurality of heat pipes 200. Alternatively, a cross-section of the heat transfer section accommodation chambers 310 in the heat dissipation structure 300 can be reversed convex-shaped, and a cross-section of the heat pipes 200 can be elliptical and arranged at the lower part of the "convex" shape, while the upper part of the "convex" shape is available for assembly and welding of the heat pipes 200.

In one embodiment, the plurality of through-pipe grooves 116 are through grooves spaced in parallel, so as to make the heat pipes 200 directly contact a heating element to accelerate heat transfer. Alternatively, the plurality of through-pipe grooves 116 are spaced in parallel on the surface of the heating element so that heat on the surface of the heating element can be transferred to the heat transfer section 220 of the heat pipes as soon as possible. Alternatively, the heat transfer section 220 of the heat pipes 200 is arranged in parallel with the extending direction of the through-pipe grooves 116. It can be understood that the heat transfer section 220 is spaced in parallel according to the arrangement of the plurality of through-pipe grooves 116.

In one embodiment, the heat transfer section 220 includes a bend portion 222 and an extension portion 224 connected to the bend portion 222. The bend portion 222 may be arc-shaped. The extending direction of the extension portion 224 is parallel to the extending direction of the through-pipe grooves 116. In the extending direction from the heat absorption section 210 to the heat transfer section 220, the heat pipes 200 transfer heat from the bend portion 222 to the direction away from the heat absorption section 210. In one embodiment, the heat transfer section accommodation chamber 310 includes a recess and a through hole, where the recess is configured to accommodate the bend portion 222 and the through hole is configured to accommodate the extension portion 224. Alternatively, the extension portion 224 penetrates the through hole disposed on the heat transfer section accommodation chamber 310 of the heat dissipation structure 300. In the present embodiment, the bend portion 222 and the extension portion 224 make the heat transfer sections 220 more widely distributed in the heat dissipation structure 300 with a larger contact area, so as to better dissipate heat.

Alternatively, as shown in FIG. 1 and FIG. 2, the extending direction of the bend portion 222 may be perpendicular to the extending direction of the through-pipe grooves 116, which differs the extending direction of the extension portion 224. The bend portion 222 and the extension portion 224 of the plurality of heat pipes 200 can bend and extend in different directions respectively to make the heat pipes 200 distribute more evenly in the heat dissipation structure 300, so as to better dissipate heat.

In one embodiment, the base 100 is thermally contacted with the heating element, and a thermally conductive material is arranged between the heating element and the base 100. Specifically, the heating element is thermally contacted with the second surface 114 of the support plate 110. In one embodiment, the thermally conductive material may be a thermally conductive adhesive or a metal with excellent thermally conductive performance or a combination of both. For example, the thermally conductive material may be one of copper, gold or silver. In the present embodiment, the thermally conductive material can accelerate heat transfer and enhance the heat dissipation effect of the heat dissipation device 10.

In one embodiment, the heat pipe 200 is thermally contacted with the heating element, and a thermally conductive material is arranged between the heating element and the heat pipe 200. In one embodiment, the thermally conductive material may be a thermal conductive adhesive, a metal with excellent thermal conductivity or a combination of both. For example, the thermally conductive material may be one of copper, gold or silver. In the present embodiment, the thermally conductive material can accelerate the heat transfer speed and enhance the heat dissipation effect of the heat dissipation device 10.

In one embodiment, the base 100 further includes a heat conducting plate 120. The heat conducting plate 120 is arranged on the second surface 114 and covers the plurality of through-pipe grooves 116. The heat absorption section 210 is thermally contacted with the heat conducting plate 120. In the present embodiment, the heat conducting plate 120 can accelerate the rate of heat transfer, thus accelerating the heat dissipation.

The heat conducting plate 120 may be a metal or other thermally conductive material. The thermal conductivity of the thermally conductive board 120 is greater than that of the support plate 110. Alternatively, the heat conducting plate 120 can be a copper sheet. A part of the support plate 110 connected with the heating conducting plate 120, and the heat pipe 200 are welded at the surface of the copper sheet. Furthermore, a side of the copper sheet away from the support plate 110 is coated with thermally conductive material such as thermally conductive adhesive. The thermally conductive adhesive can be thermally conductive silicone grease or thermally conductive silicone gel. Alternatively, the heat dissipation device 10 is configured to dissipate heat for the board card, and a side of the heat conducting plate 120 away from the support plate 110 covers a power-hungry chip of the board card.

In one embodiment, the base 100 further includes a frame 130 arranged around the support plate 110. The frame 130 is fixed to the edge of the support plate 110, and the frame 130 and the support plate 110 form an accommodation space 134 in which the heat dissipation structure 300 and the heat pipe 200 are accommodated.

Alternatively, the frame 130 can be integrated with the support plate 110. Alternatively, the frame 130 is perpendicular to the first surface 112. The accommodation space 134 is a long strip cavity. The frame 130 may protect the heat dissipation structure 300 and the heat pipe 200, and simultaneously increase the stability of the heat dissipation device 10.

In one embodiment, as shown in FIG. 1 and FIG. 2, part of the plurality of heat pipes 220 are attached to the first surface 112 of the support plate 110, and the first surface 112 is arranged with a buried-pipe groove 118 to accommodate the heat transfer section 220 of part of the heat pipes 200 attached to the support plate 110. Alternatively, the buried-pipe groove 118 can be a blind groove such that the heat transfer section 220 does not penetrate the base 100.

Figure 6:
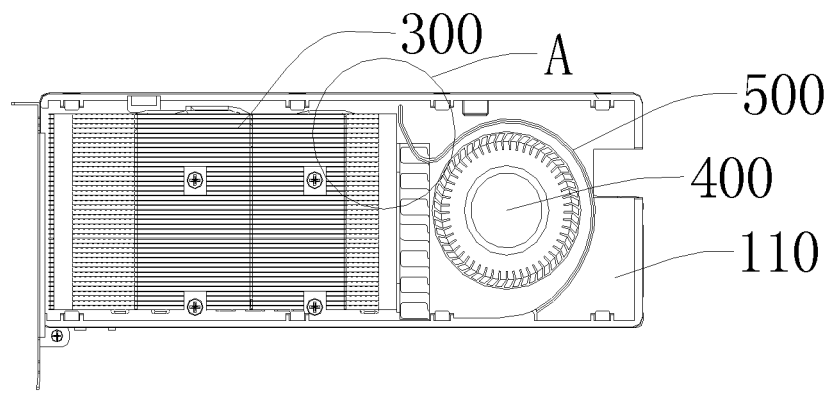
FIG. 6 is a top view of a heat dissipation device according to an embodiment of the present disclosure.
Figure 7:
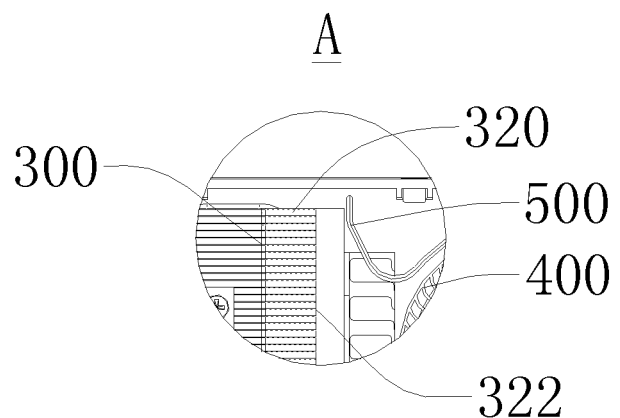
FIG. 7 is a partial enlargement diagram of circle A area in FIG. 6.

Referring to FIG. 6 and FIG. 7, in one embodiment, the heat dissipation structure 300 includes a plurality sets of heat dissipation fins spaced in parallel. The gap between two adjacent heat dissipation fins forms a strip air duct 320, alternatively, the gap between the heat dissipating fins, that is, the width of the strip air duct 320, can be adjusted according to actual needs. The heat dissipation surface area of the heat dissipation fins is large, so that the heat dissipation effect is better. In one embodiment, the width of the strip air duct 320 can be 1.5 mm-2.5 mm. Alternatively, the width of the strip air duct 320 can be 2.0 mm, thus being capable of reducing noise and accelerating heat dissipation.

In one embodiment, two ends of the strip air duct 320 are an air inlet 322 and an air outlet 324 respectively. The heat dissipation device 10 further includes a turbo fan 400. The turbo fan 400 is arranged on the first surface 112 and is opposite to the air inlet 322. In the present embodiment, the wind can be blow directly into the air inlet 322 by the turbo fan 400 and out from the air outlet 324, thereby accelerating the heat dissipation within the heat dissipation structure 300 and greatly accelerating the heat dissipation speed of the heat dissipation device 10. Meanwhile, the turbo fan 400 includes two characteristics: small size and large air volume. The height of the turbo fan 400 can be adjusted according to actual requirements. In one embodiment, the height of the turbo fan 400 is the same as that of the heat dissipation structure 300.

Figure 8:
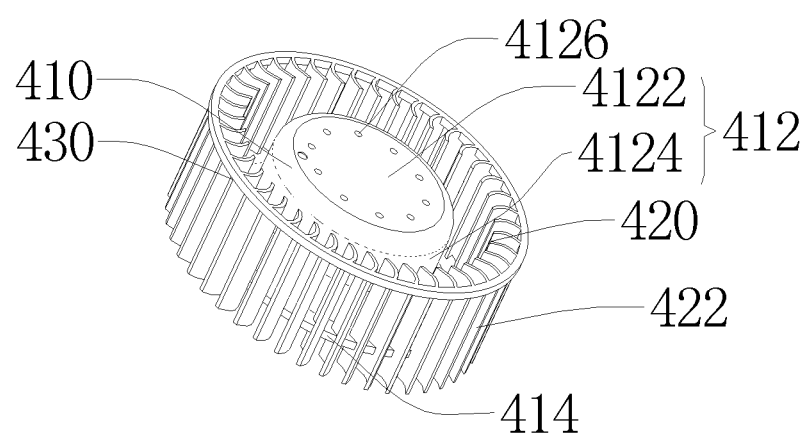
FIG. 8 is a structural diagram of a turbo fan according to an embodiment of the present disclosure.
Figure 9:
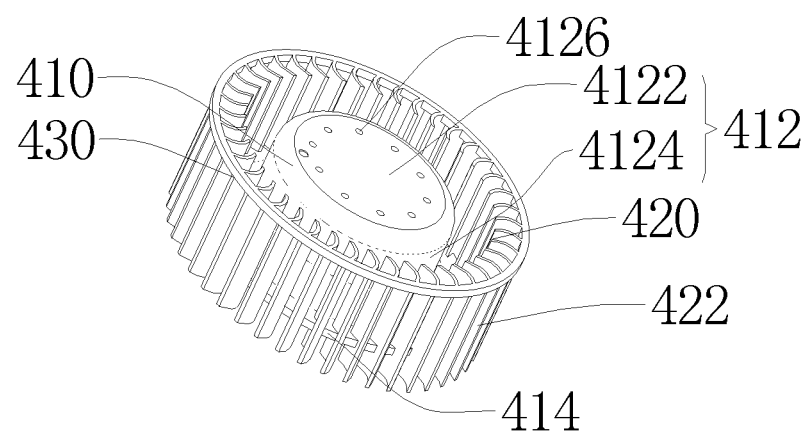
FIG. 9 is a top view of a turbo fan according to an embodiment of the present disclosure.

Referring to FIG. 8 and FIG. 9, the present disclosure provides a turbo fan 400, including a rotor housing 410 and a fan blade structure 420 arranged around the rotor housing 410. The fan blade structure 420 is fixed to the periphery of the rotor housing 410 and includes a plurality of spaced fan blades 422 extending in the same direction. Alternatively, the plurality of fan blades 422 of the fan blade structure 420 are centrally symmetrical with respect to the axis of the rotor housing 410. The arc length of a cross section of the fan blade 422 is $1/8$-$1/6$ of the circumference of the circle in which the arc is located. It is understandable that a central angle corresponding to the arc lie between 45 to 60 degrees. The shape of the fan blade 422 is a "tile" type and a cross section of the "tile" is an arc, the arc length is $1/8$-$1/6$ of the circumference of the circle in which the arc is locate. In one embodiment, the length of the arc is $1/7$ of the circumference of the circle in which the arc is located.

In the present embodiment, the turbo fan 400 sets the fan blade 422 with an arc section, and when the turbo fan 400 rotates in the direction corresponding to a recess of the fan blade 422, the arc structure of the fan blade 422 can push more air to increase air volume. Meanwhile, since the length of the arc is $1/8$-$1/6$ of the circumference of the circle where the arc is located, the fan blade 422 has an appropriate radian, thus effectively reducing wind resistance and then effectively reducing noise and increasing air volume.

The material of the rotor housing 410 is not limited as long as the shape can be maintained. In one embodiment, the material of the rotor housing 410 can be a metal or a chemical product. For example, the material of the rotor housing 410 can be aluminum or aluminum alloy. In one embodiment, a cross section of the rotor housing 410 can be circular. The material of the fan blade 422 is not limited as long as the shape can be maintained. In one embodiment, the material of the fan blade 422 can be a metal or chemical product. For example, the material of the fan blade 422 can be aluminum or aluminum alloy. In one embodiment, the fan blade structure 420 is integrated with the rotor housing 410, so that the overall structure is more stable.

In one embodiment, the rotor housing 410 includes an accommodation bucket 412 and an annular connecting plate 414 fixedly connected to the outer edge of the accommodation bucket 412, where the accommodation bucket 412 forms a fan rotor accommodation space around to accommodate fan rotors, and the fan blade structure 420 is arranged around the annular connecting plate 414 and fixedly connected to the annular connecting plate 414. And the fan blade structure 420 can be spaced with the accommodation bucket 412. Alternatively, the fan blade structure 420 can be fixedly connected to the accommodation bucket 412.

Alternatively, the annular connection plate 414 is perpendicular to the axis of the accommodation bucket 412. Alternatively, a connection between the annular connecting plate 414 and the accommodation bucket 412 is arranged in an arc shape, thereby reducing wind resistance and noise. In one embodiment, the accommodation bucket 412 is integrated with the annular connecting plate 414, and the structure is stable.

Alternatively, the accommodation bucket 412 includes a top plate of accommodation bucket 4122 and a side plate of accommodation bucket 4124. The side plate of accommodation bucket 4124 is arranged around the edge of the top plate of accommodation bucket 4122 and fixedly connected to the edge of the top plate of accommodation bucket 4122. The annular connecting plate 414 is fixedly arranged at one side of the side plate of accommodation bucket 4124, and the side is away from the top plate of accommodation bucket 4122. When the turbo fan 400 rotates, air current flows through the side plate of accommodation bucket 4124 from the top plate of accommodation bucket 4122 to the annular connecting plate 414.

In one embodiment, the accommodation bucket 412 further includes a plurality of heat-dissipation holes 4126, and the plurality of heat-dissipation holes 4126 are arranged at the surface of the accommodation bucket 412. In one embodiment, the plurality of heat-dissipation holes 4126 may be disposed on the top plate of accommodation bucket 4122, which can dissipate heat generated by rotors in the rotor housing 410 faster. In one embodiment, the plurality of heat-dissipation holes 4126 may be disposed on the side plate 4124 of the accommodation bucket. In one embodiment, the heat-dissipation holes 4126 can be equally spaced and the shape of the heat-dissipation hole 4126 is not limited. In one embodiment, the shape of the heat-dissipation holes 4126 may be circular or polygonal. Specifically, the shape of the heat-dissipation holes 4126 may be triangle, quadrilateral or hexagon. In the present embodiment, the heat-dissipation holes 4126 may be through holes that penetrate the inner part of the rotor housing 410 to facilitate dissipating heat from rotors.

In one embodiment, the turbo fan 400 further includes an annular bracket 430 arranged around the rotor housing 410. The annular bracket 430 is fixedly connected to the plurality of fan blades 422. In one embodiment, the annular bracket 430 is fixedly connected to all the fan blades 422 within the fan blade structure 420. In one embodiment, the annular bracket 430 is integrated with the fan blade structure 420. In the present embodiment, the annular bracket 430 makes the fan blade structure 420 more stable and avoids noise caused by the shaking of the fan blade 422.

In one embodiment, the annular bracket 430 is arranged at one end of the fan blade 422 away from the annular connecting plate 414. The two ends of the fan blade 422 in the vertical direction of the annular connecting plate 414 are respectively fixed, so as to make the fan blade structure 420 more stable and avoid noise caused by the shaking of the fan blade 422.

In one embodiment, the axis of the fan blade 422 along the longitudinal direction of the fan blade can be perpendicular to the annular connection plate 414. It is understandable that the fan blade 422 is integrally perpendicular to the annular connecting plate 414, so that the outlet direction of the turbo fan 400 is parallel to the annular connecting plate 414. In one embodiment, the fan blade 422 can be inclined to the surface of the annular connection plate 414. The arc-shaped fan blade 422 has a recess surface and a projection surface opposite to the recess surface. When an angle between the recess surface of the fan blade 422 and a surface of annular connecting plate 414 near the top plate of accommodation bucket 4122 is acute, the outlet direction of the turbo fan 400 is concentrated in the direction close to the annular connecting plate 414. When the angle between the recess surface of the fan blade 422 and a surface of annular connecting plate 414 near the top plate of accommodation bucket 4122 is obtuse, the outlet direction of the turbo fan 400 is concentrated in the direction away from the annular connecting plate 414.

Figure 10:
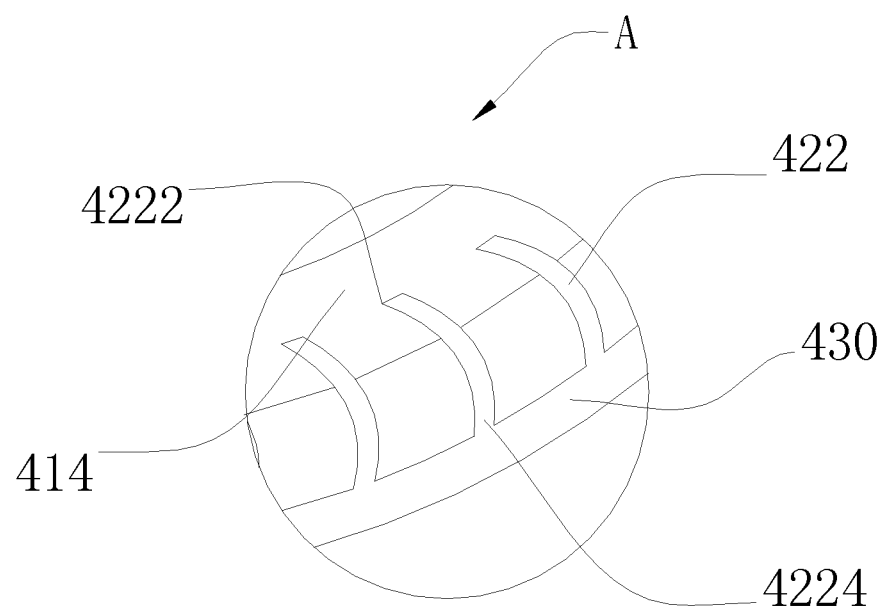
FIG. 10 is a partial enlargement diagram of circle A area in FIG. 9.

Referring to FIG. 10, in one embodiment, two ends of the arc of the fan blade are an air inlet 4222 arranged near the rotor housing 200 and an air outlet 4224 away from the air inlet 4222 respectively, where the air inlet 4222 is blade-shaped. The air current generated by the rotation of the turbo fan 400 flows into the fan blade structure 420 from the air inlet 4222 and flows out of the fan blade structure 420 from the air outlet 4224. The air inlet 4222 is configured to intercept the air current entering the fan blade structure 420 during the rotation of the fan blade structure 420. In the present embodiment, the air inlet 4222 is arranged to be blade-shaped to reduce wind resistance and facilitate intercepting air current, thereby reducing noise.

In one embodiment, an angle between a tangential line of the arc at the air outlet 4224 and a tangent line of the fan blade structure 420 at the air outlet 4224 is acute. In one embodiment, the angle may lie between 30 to 60 degrees. In one embodiment, the angle may be 45 degrees.

In the present embodiment, the angle between a tangential line of the arc at the air outlet 4224 and a tangent line of the fan blade structure 420 at the air outlet 4224 is acute, so as to make the axis of the fan blade 422 close to the axis of the rotor housing 200. The fan blade 422 with such an angle may facilitate the air current to be generated and accelerated by the fan blade 422, thus accelerating outflow speed and increasing air volume.

In one embodiment, the diameter of a circle in which an arc-shaped cross section of the fan blade 422 is located is $1/10$-$1/6$ of an outer diameter of the fan blade structure 420. In one embodiment, the diameter of the circle in which the arc-shaped cross section of the fan blade 422 is located may be $1/9$ of the outer diameter of the fan blade structure 420. In one embodiment, the diameter of the circle in which the arc-shaped cross section of the fan blade 422 is located may be $1/8$ of the outer diameter of the fan blade structure 420. In one embodiment, the diameter of the circle in which the arc-shaped cross section of the fan blade 422 is located may be $1/7$ of the outer diameter of the fan blade structure 420. In one embodiment, the radian length of a cross section of the fan blade 422 can be 6.6 mm. In one embodiment, the outer diameter of the fan blade structure 420 can be 66 mm.

Figure 11:
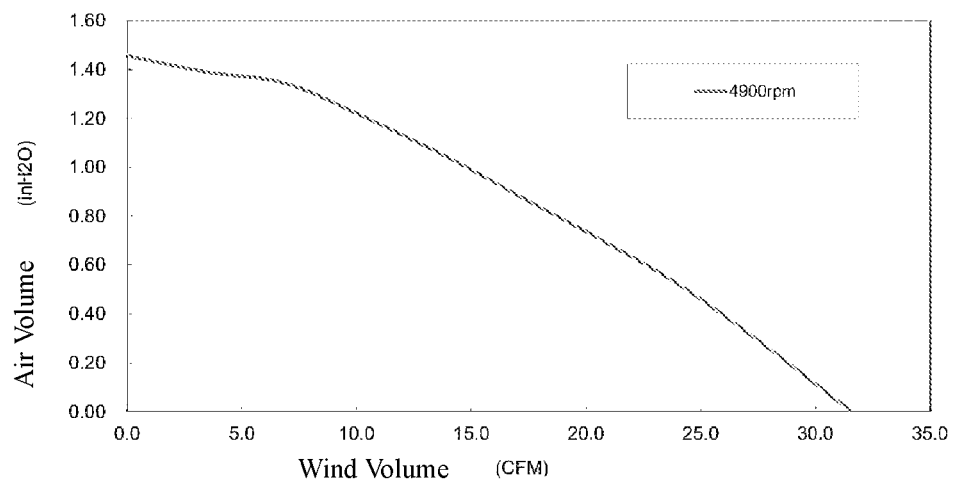
FIG. 11 is a diagram showing test effects of air volume and wind pressure of a turbo fan according to an embodiment of the present disclosure.

In the present embodiment, the size of the fan blade 422 is in proportion to that of the turbo fan 400 and the overall compatibility is better, so that the condition of air inlet and air outlet is more balanced. In this case, the air volume and wind pressure at the air outlet of the turbo fan 400 can achieve an ideal result (see FIG. 11). In one embodiment, the rotational speed of the turbo fan 400 can be 4900 rpm.

Figure 12:
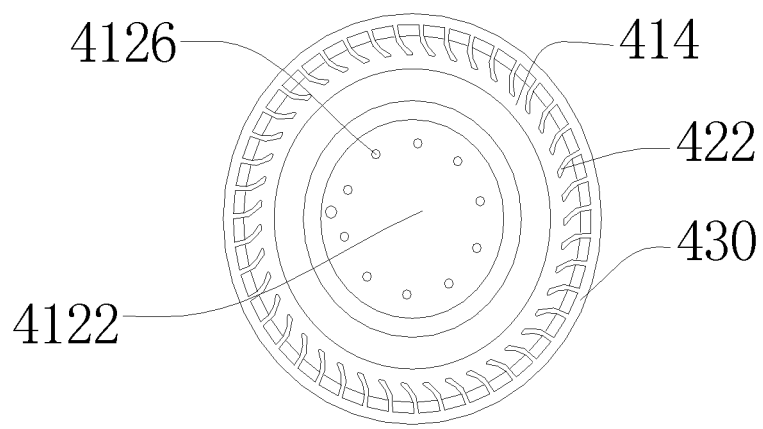
FIG. 12 is a top view of a turbo fan according to another embodiment of the present disclosure.

In one embodiment, the annular bracket 430 is arranged at the air outlet 4224 and the end of the fan blade 422 away from the annular connecting plate 414. When the air current flows out, the annular bracket 430 can act as a barrier to prevent the air current from flowing away from the annular connecting plate 414. Please also refer to FIG. 12, In one embodiment, the air outlet 4224 is perpendicular to a tangent line of the outer edge of the fan blade structure 420 at the air outlet 4224 to facilitate the air in the turbo fan 400 to flow out.

Figure 13:
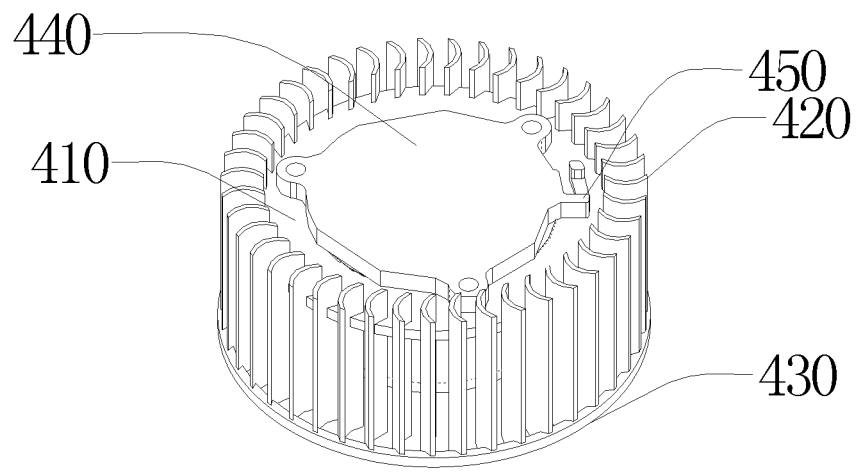
FIG. 13 is a bottom view of a turbo fan according to an embodiment of the present disclosure.
Figure 14:
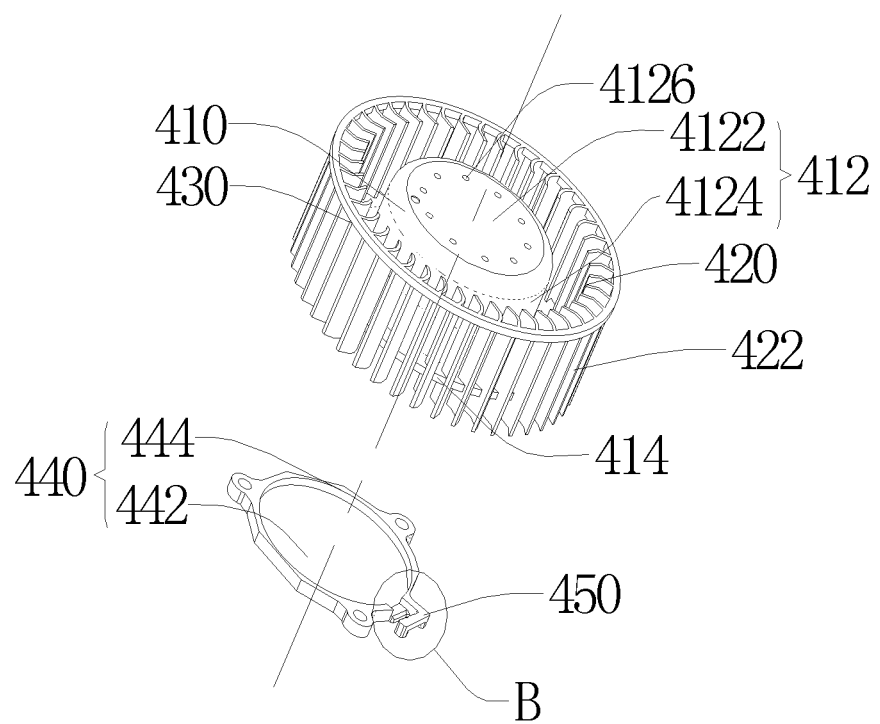
FIG. 14 is a diagram of the exploded structure of a turbo fan according to an embodiment of the present disclosure.
Figure 15:
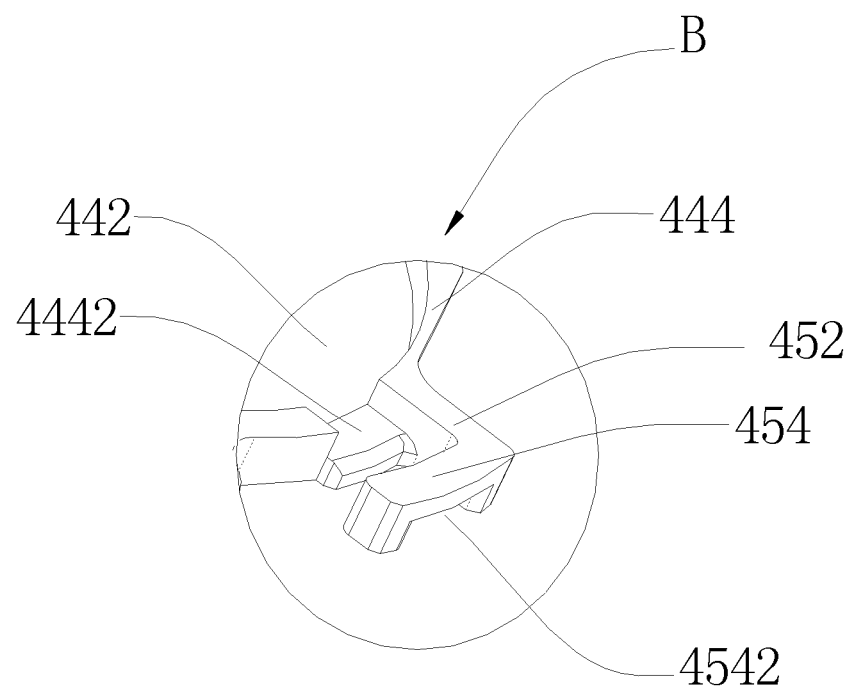
FIG. 15 is a partial enlargement diagram of circle B area in FIG. 14.

Referring to FIG. 13 and FIG. 14, in one embodiment, the turbo fan 400 further includes an installation chassis 440, and the installation chassis 440 and the rotor housing 410 are oppositely and rotatably connected. The installation chassis 400 includes an installation plate 442 and a side panel 444 arranged in the periphery of the installation plate 442, where the side panel 444 and the installation plate 442 form a groove around. As shown in FIG. 15, the side panel 444 is arranged with a wire passing groove 4442.

In one embodiment, the installation chassis 440 is fixedly installed on the first surface 112 of the support plate 110. The first surface 112 of the support plate 110 is arranged with a circular groove corresponding to the installation chassis 440 for accommodating the installation chassis 440. The installation chassis 440 and the support plate 110 can be fixedly connected by screws. Specifically, three screw holes are equally spaced in the periphery of the installation chassis 440, and the installation chassis 440 is connected to the support plate 110 by screws passed through the screw holes. The material of the installation chassis 440 is not limited as long as the shape can be maintained. In one embodiment, the installation chassis 440 may be metal. Specifically, the installation chassis 440 can be aluminum or aluminum alloy to facilitate heat dissipation of the turbo fan 400. The shape of the installation chassis 440 is not limited. In one embodiment, the shape of the installation chassis 440 can be a circular plate or a polygonal plate. In one embodiment, a plurality of cutting edges are spaced in the side panel 444 to make the installation chassis 440 irregularly circular, thus avoiding the problem that the installation chassis 440 cannot be installed due to errors in the circular grooves set on the first surface 112 corresponding to the installation chassis 440 during the production process.

In one embodiment, the side panel 444 is perpendicular to the installation plate 442. The groove formed by the side panel 444 and the installation plate 442 is configured to accommodate rotors and the wire passing groove 4442 is configured to allow wires connecting the rotors to pass through for assembly. The installation chassis 440 is arranged with a shaft at the axis on the side facing the rotor housing 410, and the rotor of the fan is installed on the shaft and can rotate around the shaft.

Referring to FIG. 15, in one embodiment, the turbo fan 400 further includes a fan terminal 450, and the fan terminal 450 is configured to protect connecting wires of the turbo fan 400. The fan terminal 450 includes a connecting arm 452 and a wire pressing arm 454. One end of the connecting arm 452 is fixedly connected to the side panel 444. One end of the wire pressing arm 454 is fixedly connected to the end of the connecting arm 452 away from the side panel 444, and the other end is spaced with the side panel 444. The wire pressing arm 454 and the connecting arm 452 are located on the same plane as the installation plate 442. A surface of the wire pressing arm 454 away from the rotor housing 410 is arranged with a wire pressing groove 4542, and the wire pressing groove 4542 is arranged corresponding to the wire passing groove 4442.

In one embodiment, the wire pressing arm 454 forms an L-shape with the connecting arm 452. Alternatively, the shape of the fan terminal 450 can also be annular. An interval between the wire pressing arm 454 and the side panel 444 forms an opening, and the opening facilitates the connecting wires to pass through and then enter the fan terminal 450. The wire pressing groove 4542 can form an interval between the fan terminal 450 and the base 100 so as to facilitate the connecting wires to pass through. In one embodiment, the fan terminal 450 is integrated with the installation chassis 440. In one embodiment, the fan terminal 450 is as thick as the installation chassis 440.

In the present embodiment, connecting wires are led from the wire passing groove 4442 to the wire pressing groove 4542 and are then led out, so as to protectively enclose the connecting wires and avoid influencing the connecting wires when the turbo fan 400 rotates, thus preventing interference.

In one embodiment, as shown in FIG. 6 and FIG. 7, the heat dissipation device 10 further includes a guide wall 500. The guide wall 500 is arranged around the turbo fan 400 and is disposed on the first surface 112, and the guide wall is also protruded out of the first surface 112. The guide wall 500 is arranged with an outlet, and the guide outlet is oriented towards the air inlet 322. In one embodiment, the height of the guide wall 500 is the same as that of the turbo fan 400. In one embodiment, as shown in FIG. 1 and FIG. 2, two ends of the guide wall extend to opposite sides of the frame 130 respectively so as to lead wind to more of the strip air ducts 320.

In the present embodiment, the guide wall 500 is configured to block the wind generated by the turbo fan 400 and lead the wind to the direction of the heat dissipation fin 200, thereby increasing the air volume entering the heat dissipation fin 200 and reducing the waste of wind generated by the turbo fan 400.

In one embodiment, the guide outlet is oriented towards an opening of the strip air duct 320. It is understandable that the guide outlet is oriented towards an opening of the strip air duct 320 of the heat dissipation fin to allow wind to directly enter the strip air duct 320 and then reduce wind waste. In one embodiment, the guide outlet is arranged oppositely to the opening of all the strip air duct 320.

In one embodiment, a shape of a cross section of the guide wall 500 in a direction of a radial surface of the turbo fan 400 is a streamline. Wind resistance of the streamlined guide wall 500 is small, so as to avoid wind waste and achieve the best heat dissipation effect.

In one embodiment, the heat dissipation device further includes a casing. The casing covers the heat dissipation structure 300 and the base 100, and is fixedly connected to the base 100. A protrusion is arranged in the casing at a surface towards the guide wall 500. The protrusion has the same extension shape as the guide wall 500 and is engaged with the guide wall 500. In one embodiment, the height of the guide wall 500 is lower than that of the turbo fan 400, which facilitates the assembly of the turbo fan 400. In the present embodiment, the protrusion of the housing surface is directly engaged with the guide wall 500 to semi-enclose the radial direction of the turbo fan 400. In this case, the wind flowing out of the turbo fan 400 is led out from the guide outlet to maximize the utilization of wind generated by the turbo fan 400, thereby achieving better heat dissipation effect with the same fan volume.

In one embodiment, the casing is arranged with an air inlet, and the air inlet is arranged correspondingly to the turbo fan 400. The air inlet is arranged in the axial direction of the turbo fan 400, therefore the turbo fan 400 inlets air in the axial direction and outlets air in the radial direction. In one embodiment, the air inlet can be a circle, and the center of the circle faces the axis of the turbo fan 400. In the present embodiment, the air inlet facilitates air intake.

In one embodiment, as shown in FIG. 1 and FIG. 7, the heat dissipation device 10 further includes a baffle 600. The baffle 600 is arranged oppositely to the outlet 324 and is fixedly connected to the base 100. The baffle 600 is arranged at an end of the base 100, alternatively, the baffle 600 is fixed to an end of the base 100 by screws. The baffle 600 is arranged with a plurality of holes to keep the air flow of the outlet 324 smooth. The baffle 600 is configured to prevent impurities such as shredded paper in the external environment from entering the outlet 324.

In one embodiment, as shown in FIG. 1 and FIG. 2, the heat dissipation device 10 further includes a backplane 700, and the backplane 700 is arranged oppositely to the second surface 114 and is fixedly connected to the support plate 110. The material of the backplane 700 can be metal or other thermally conductive material as long as the shape can be maintained. In one embodiment, the backplane 700 can be made of aluminum or aluminum alloy to make the backplane 700 portable with excellent thermal conductivity. The shape of the backplane 700 is not limited and can be designed according to actual needs. In one embodiment, the heat dissipation device 10 is configured to dissipate the heat generated by a board card, and the board card is arranged between the support plate 110 and the backplane 700. The backplane 700 is in thermal contact with a heating element of the board card on one side away from the base 100. In one embodiment, a thermally conductive material is arranged between the backplane 700 and the heating element. The thermally conductive material can be a thermally conductive adhesive or a metal with excellent thermal conductivity or a combination of both. In one embodiment, the thermally conductive material may be a thermally conductive pad. Specifically, the thermally conductive pad can be a thermally conductive silicon grease sheet. In one embodiment, an insulating Mylar is arranged between the backplane 700 and the area of the board card except the heating element to provide insulating protection.

In the present embodiment, the backplane 700 can dissipate heat with other elements of the heat dissipation device 10 to achieve faster heat dissipation.

In one embodiment, the backplane 700 further includes a reinforcement rib 710 arranged at a surface of the backplane 700 towards the support plate 110 and the reinforcement rib 710 protrudes the surface. In one embodiment, the reinforcement rib 710 is arranged to enclose a power-hungry chip of the board card to fasten the chip. In one embodiment, the reinforcement rib 710 can be annular. In one embodiment, the reinforcement rib 710 can be square.

Technical features of the above-mentioned embodiments may be arbitrarily combined. For the sake of concise description, not all possible combinations of the technical features in the above-mentioned embodiments are described. However, as long as there is no contradiction between the combinations of the technical features, the combination should be considered within the scope of the present specification.

The described embodiments merely introduce some implementations of the present disclosure and the description is specific, but the embodiments should not be considered as limitations to the scope of the present disclosure. It should be noted that modifications and improvements made by those of ordinary skill in the art without departing from the present disclosure shall fall within the protection scope of the present disclosure. Therefore, the protection scope of the present disclosure shall be subject to the claims.

What is claimed is:

1. A heat dissipation device, comprising:
  a base, comprising a support plate, wherein the support plate comprises a first surface and a second surface opposite to the first surface;
  a plurality of through-pipe grooves disposed on the support plate, and the through-pipe grooves penetrate the first surface and the second surface;
  a plurality of heat pipes including a first heat pipe, a second heat pipe, and a third heat pipe, each of the heat pipes comprising a heat absorption section and a heat transfer section connected to the heat absorption section,
    wherein the heat absorption section of the first heat pipe is arranged in a first one of the through-pipe grooves and the heat transfer section of the first heat pipe is away from the support plate,
    wherein the heat transfer section of the first heat pipe includes a bend portion and an extension portion,
    wherein the extension portion of the first heat pipe is parallel to the plurality of through-pipe grooves,
    wherein the bend portion of the first heat pipe extends from one end of the heat absorption section of the first heat pipe away from the support plate,
    wherein one end of the bend portion of the first heat pipe is connected to the extension portion of the first heat pipe,
    wherein the heat absorption section of the second heat pipe is arranged in a second one of the through-pipe grooves and the heat transfer section of the second heat pipe is mounted in a buried-pipe groove disposed on the support plate,
    wherein the heat absorption section of the third heat pipe is arranged in a third one of the through-pipe grooves and the second heat pipe is mounted in another buried-pipe groove disposed on the support plate, and
    wherein the extension portion of the second heat pipe is not parallel to the extension portion of the third heat pipe; and
  a heat dissipation structure arranged on the first surface, wherein at least one of the heat transfer sections of the plurality of heat pipes extend into interior portions of the heat dissipation structure and contact the heat dissipation structure.

2. The heat dissipation device of claim 1, wherein the heat dissipation structure is arranged with a heat transfer section accommodation chamber for accommodating the heat transfer sections of the first heat pipe.

3. The heat dissipation device of claim 1, wherein the plurality of through-pipe grooves are through grooves and are spaced in parallel.

4. The heat dissipation device of claim 1, wherein the base further comprises a heat conducting plate arranged on the second surface, the heat conducting plate covering the plurality of through-pipe grooves, and the heat absorption section is in thermal contact with the heat conducting plate.

5. The heat dissipation device of claim 1, wherein the base further comprises a frame arranged around the support plate, and the frame is fixed to an edge of the support plate, and the frame and the support plate form an accommodating space in which the heat dissipation structure and the heat pipes are accommodated.

6. The heat dissipation device of claim 1, wherein part of the plurality of heat pipes are attached to the support plate, and the first surface is arranged with the buried-pipe groove to accommodate the heat transfer section of the second heat pipe attached to the support plate.

7. The heat dissipation device of claim 1, further comprising: a rotor housing comprises:
   an accommodation bucket, forming a fan rotor accommodation space around to accommodate a fan rotor; and
   an annular connecting plate fixedly connected to an outer edge of the accommodation bucket, and the fan blade structure arranged around the annular connecting plate and fixedly connected to the annular connecting plate.

8. The heat dissipation device of claim 7, wherein the accommodation bucket comprises:
   a top plate of accommodation bucket; and
   a side plate of accommodation bucket, arranged around an edge of the top plate of accommodation bucket and fixedly connected to the edge of the top plate of accommodation bucket, the annular connecting plate fixedly arranged at one side of the side plate away from the top plate.

9. The heat dissipation device of claim 1, wherein the heat dissipation device further comprises a backplane, arranged oppositely to the second surface and fixedly connected to the support plate.

* * * * *